(12) United States Patent
Duong et al.

(10) Patent No.: US 8,217,399 B2
(45) Date of Patent: Jul. 10, 2012

(54) PHOTON TUNNELING LIGHT EMITTING DIODES AND METHODS

(75) Inventors: Dung T. Duong, Cedar Park, TX (US); William Gregory Flynn, Austin, TX (US)

(73) Assignee: Illumitex, Inc., Austin, TX (US)

( * ) Notice: Subject to any disclaimer, the term of this patent is extended or adjusted under 35 U.S.C. 154(b) by 47 days.

(21) Appl. No.: 12/511,396

(22) Filed: Jul. 29, 2009

(65) Prior Publication Data

US 2010/0025655 A1 Feb. 4, 2010

Related U.S. Application Data

(60) Provisional application No. 61/085,717, filed on Aug. 1, 2008.

(51) Int. Cl.
*H01L 33/20* (2010.01)
(52) U.S. Cl. ............ 257/79; 438/22; 257/E33.005
(58) Field of Classification Search ............ 257/79, 257/E33.005; 438/22
See application file for complete search history.

(56) References Cited

U.S. PATENT DOCUMENTS

| | | | |
|---|---|---|---|
| 5,790,583 A | 8/1998 | Ho | |
| 7,153,015 B2 | 12/2006 | Brukilacchio | |
| 7,300,175 B2 | 11/2007 | Brukilacchio | |
| 2002/0167029 A1* | 11/2002 | Koike et al. | 257/201 |
| 2003/0036217 A1 | 2/2003 | Richard | |
| 2007/0029560 A1* | 2/2007 | Su | 257/98 |
| 2007/0108459 A1 | 5/2007 | Lu | |
| 2007/0187697 A1* | 8/2007 | Wu et al. | 257/79 |
| 2008/0303053 A1 | 12/2008 | Lester et al. | |
| 2009/0087937 A1 | 4/2009 | Kim | |

OTHER PUBLICATIONS

International Search Report and Written Opinion, International Patent Application No. PCT/US09/051962, mailed Sep. 15, 2009, 5 pgs.
Lumileds introduces thin film flip chips to boost LED brightness, LEDs Magazine, Jul. 11, 2007, at http://www.ledsmagazine.com/news/4/7/16 printed Nov. 30, 2009, 2 pgs.
Eissler et al., LED Technology Trends, OSRAM Opto Semiconductors, Leibnizstr, Regensburg, 2005, at http://www.csmantech.org/Digests/2005/2005papers/6.1.pdf, 4 pgs.
$2^{nd}$ Written Opinion issued for PCT Application No. PCT/US2009/051962 mailed Oct. 21, 2011, 4 pgs.

* cited by examiner

*Primary Examiner* — Steven J Fulk
(74) *Attorney, Agent, or Firm* — Sprinkle IP Law Group

(57) ABSTRACT

Embodiments described herein include LEDs that promote photon tunneling. One embodiment of an LED device can have a quantum well layer adapted to generate light having a wavelength, a p-doped alloy layer on a first side of the quantum well layer and an n-doped alloy layer on the other side of the quantum well layer. The device can also include an electrode electrically connected to the p-doped alloy layer and an electrode electrically connected to the n-doped alloy layer. According to one embodiment the thickness of the n-doped alloy layer is less than the wavelength of light generated by the quantum well layer to allow light generated by the quantum well layer to tunnel to the medium (e.g., air). In another embodiment, the entire layer structure can have a thickness that is less than the wavelength.

18 Claims, 4 Drawing Sheets

PHOTON TUNNELING LIGHT EMITTING DIODES AND METHODS

RELATED APPLICATIONS

This application claims priority under 35 U.S.C. §119(e) to U.S. provisional Patent Application No. 61/085,717 entitled "Photon Tunneling Light Emitting Diodes and Methods" filed Aug. 1, 2008, which is hereby fully incorporated by reference herein.

TECHNICAL FIELD OF THE INVENTION

This disclosure regards optical devices and in particular light emitting diodes ("LEDs"). More particularly, this disclosure relates to LEDs that promote photon tunneling.

BACKGROUND OF THE INVENTION

Light emitting diodes ("LEDs") are ubiquitous in electronics. They are used in digital displays, lighting systems, computers and televisions, cellular telephones and a variety of other devices. Developments in LED technology have led to methods and systems for the generation of white light using one or more LEDs. Developments in LED technology have led to LEDs that generate more photons and thus more light than previously. The culmination of these two technological developments is that LEDs are being used to supplement or replace many conventional lighting sources, e.g. incandescent, fluorescent or halogen bulbs, much as the transistor replaced the vacuum tube in computers.

Current industry practice for construction of LEDs is to use a substrate (typically either single-crystal Sapphire or Silicon Carbide), onto which is deposited layers of materials such as GaN or InGaN. One or more layers (e.g. GaN or InGaN) may allow photon generation and current conduction. Typically, a first layer of Gallium Nitride (GaN) is applied to the surface of the substrate to form a transition region from the crystal structure of the substrate to the crystal structure of doped layers allowing for photon generation or current conduction. This is typically followed by an N-doped layer of GaN. The next layer can be an InGaN, AlGaN, AlInGaN or other compound semiconductor material layer that generates photons and that is doped with the needed materials to produce the desired wavelength of light. The next layer is typically a P doped layer of GaN. This structure is further modified by etching and deposition to create metallic sites for electrical connections to the device.

In recent years, LED manufacturers have produced thin-film LEDs. In thin-film LEDs, the substrate is removed and the GaN layer thinned to approximately 2-3 μm. In some cases a replacement substrate is applied to the thinned GaN. Light is generated in the GaN layer and must escape to the surrounding medium. However, the light can become trapped in the GaN layer due to internal reflection in the GaN and only the light that is within the escape cone actually makes it into air or the substrate. The rest of the photons are trapped within the material and eventually get absorbed as heat. The current solution to alleviate this problem is to roughen the GaN to disrupt the waveguide effect.

SUMMARY

Embodiments described herein provide LEDs that promote photon tunneling to air or other medium. Because photons tunnel directly into air, the photons do not become trapped in bulk material such as GaN or the substrate. Consequently, geometric modification of the GaN and/or substrate is not necessary to extract light trapped in the respective layer.

One embodiment of an LED device can have a quantum well layer adapted to generate light having a wavelength, a p-doped alloy layer on a first side of the quantum well layer and an n-doped alloy layer on the other side of the quantum well layer. The device can also include an electrode electrically connected to the p-doped alloy layer and an electrode electrically connected to the n-doped alloy layer.

According to one embodiment the thickness of the n-doped alloy layer is less than the wavelength of light generated by the quantum well layer to allow light generated by the quantum well layer to tunnel to the medium (e.g., air). Indeed, the entire layer structure can have a thickness that is less than the wavelength.

Another embodiment can include an LED device having a submount providing electrodes and an LED layer structure mounted to the submount. The LED layer structure can include a quantum well layer sandwiched between an n-GaN layer and a p-GaN layer, a p-metal layer disposed on the p-GaN layer, a transparent metal layer disposed on the n-GaN layer and one or more n-metal contacts disposed on the n-GaN layer. The quantum well layer can be adapted to generate light having a wavelength. The LED layer structure can be configured to allow light generated by the quantum well layer to tunnel to surrounding air.

BRIEF DESCRIPTION OF THE FIGURES

A more complete understanding of the embodiments and the advantages thereof may be acquired by referring to the following description, taken in conjunction with the accompanying drawings in which like reference numbers indicate like features and wherein.

DETAILED DESCRIPTION

The disclosure and various features and advantageous details thereof are explained more fully with reference to the exemplary, and therefore non-limiting, embodiments illustrated in the accompanying drawings and detailed in the following description. Descriptions of known starting materials and processes may be omitted so as not to unnecessarily obscure the disclosure in detail. It should be understood, however, that the detailed description and the specific examples, while indicating the preferred embodiments, are given by way of illustration only and not by way of limitation. Various substitutions, modifications, additions and/or rearrangements within the spirit and/or scope of the underlying inventive concept will become apparent to those skilled in the art from this disclosure.

As used herein, the terms "comprises," "comprising," "includes," "including," "has," "having" or any other variation thereof, are intended to cover a non-exclusive inclusion. For example, a process, product, article, or apparatus that comprises a list of elements is not necessarily limited to only those elements but may include other elements not expressly listed or inherent to such process, process, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, any examples or illustrations given herein are not to be regarded in any way as restrictions on, limits to, or express definitions of, any term or terms with which they are utilized. Instead these examples or illustrations are to be regarded as being described with respect to one particular embodiment and as illustrative only. Those of ordinary skill in the art will appreciate that any term or terms with which these examples or illustrations are utilized encompass other embodiments as well as implementations and adaptations thereof which may or may not be given therewith or elsewhere in the specification and all such embodiments are intended to be included within the scope of that term or terms. Language designating such non-limiting examples and illustrations includes, but is not limited to: "for example," "for instance," "e.g.," "in one embodiment," and the like.

Reference is now made in detail to the exemplary embodiments of the disclosure, examples of which are illustrated in the accompanying drawings. Wherever possible, like numerals will be used throughout the drawings to refer to like and corresponding parts (elements) of the various drawings.

Figure 1:
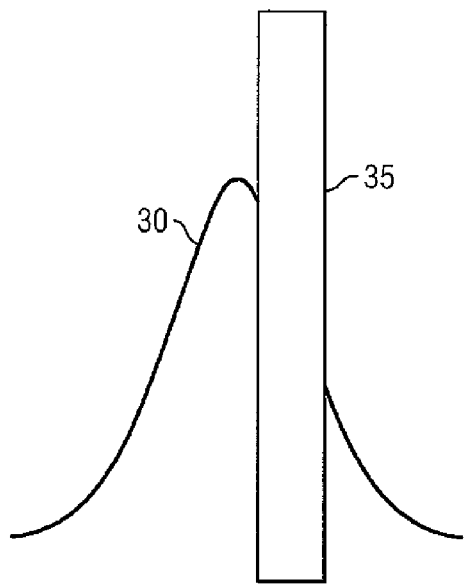
FIG. 1 is a diagrammatic representation of photon tunneling.

Photon tunneling refers to the effect that occurs when a particle encounters an infinite potential barrier. If the wave function of the particle is larger than the potential extent, then there is a probability that the particle exists beyond the potential barrier. As the potential extent is reduced, the probability of the particle appearing on the other side of the potential barrier increases. FIG. 1 illustrates a particle wave function 30 indicating the probability amplitude of a photon existing on either side of a GaN barrier 35. It can be noted as the barrier is made thinner, the probability of the photon existing beyond barrier 35 increases.

According to various embodiments of LEDs, as the distance between the quantum well layer and air decreases, the probability of photons tunneling through to air increases. Photons generated in the quantum layers will have a greater probabilistic chance of appearing in air if the n-GaN and p-GaN layers are sufficiently thin.

Figure 2:
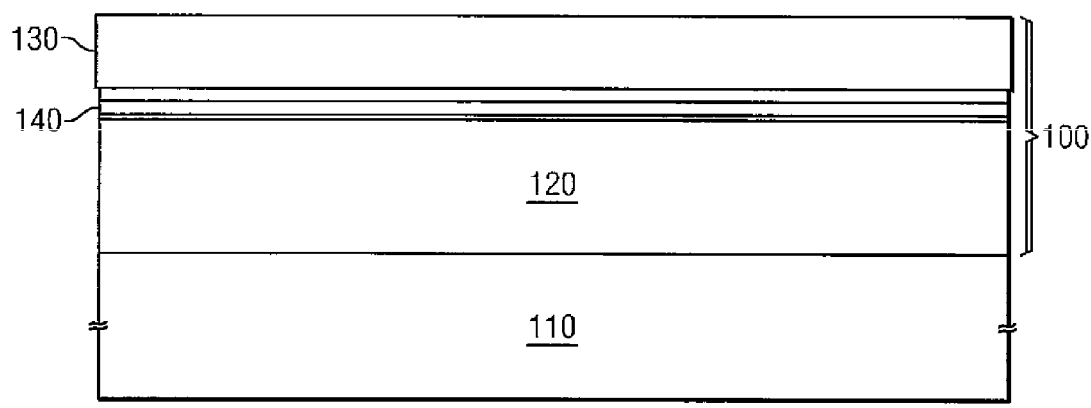
FIG. 2 is a diagrammatic representation of an embodiment of an LED layer structure and substrate.

FIG. 2 is a diagrammatic representation of an embodiment of an LED layer structure 100 and substrate 110. The substrate 110, p-GaN layer 130, n-GaN layer 120 and quantum well layer 140 are shown. In one embodiment, GaN and $Al_2O_3$ are used for the doped layers and substrate respectively. However, other suitable doped layer and substrate materials including, but not limited to, AlGaAs, AlGaP, AlGaInP, GaAsP, GaP, InGaN, SiC, Si, ZnSe, diamond, AlN, AlGaN can be used.

Quantum well layer 140 can include a single quantum well (SQW) or multiple quantum well (MQW) layer configured to generate light of a particular wavelength and may include multiple layers of material. LED layer structure 100 may include additional layers such as buffer layers or other layers.

Unlike typical LEDs in which photons appear in the GaN layers and are extracted through substrate 110, embodiments of LEDs described herein can cause at least some of the photons to tunnel directly into air or other medium. According to one embodiment, one or more of the layers surrounding the quantum well layer can be thinned sufficiently so that photons will probabilistically appear in air.

Figure 3:
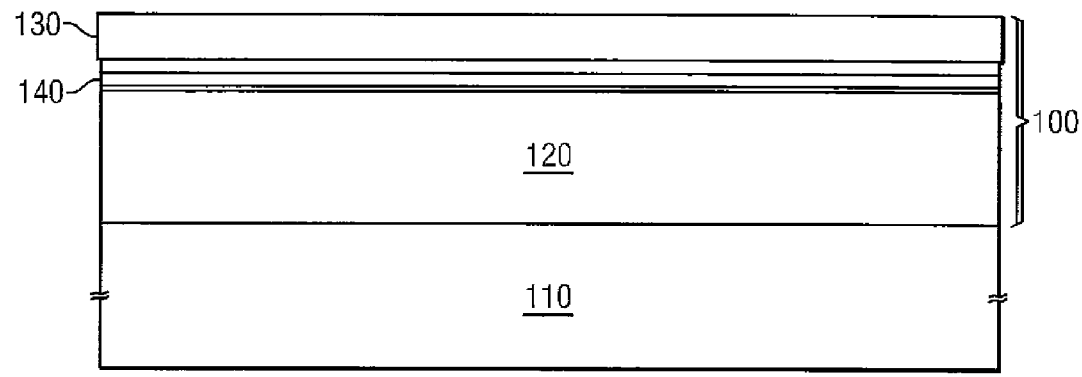
FIG. 3 illustrates an embodiment of LED layer structure with a p-GaN layer thinned to a specified thickness.
Figure 4:
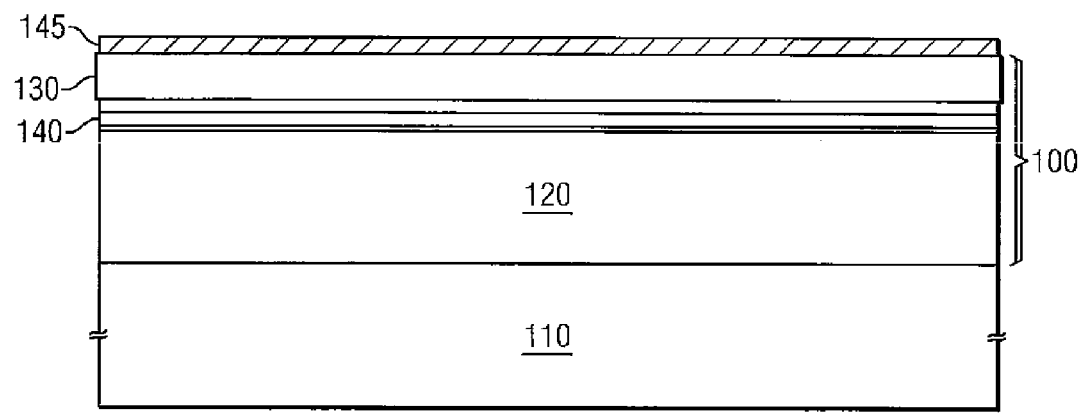
FIG. 4 is a diagrammatic representation of an embodiment of an LED layer structure with a p-metal layer.

According to one embodiment, an LED can be formed from a wafer having existing layers that are thinned to specified thicknesses. In another embodiment, the wafer can be formed initially to have layers with the specified thicknesses. FIG. 3 illustrates an embodiment of LED layer structure 100 in which p-GaN layer 130 has been thinned to a specified thickness. Material from p-GaN layer 130 can be removed by etching using laser removal, mechanical grinding, inductively-coupled plasma etching, chemical etching, photoelectochemical etching and/or polishing or other technique. When p-GaN layer is at a desired thickness, p-metals can be added to p-GaN layer 130 to provide electrical connection. In the embodiment of FIG. 4, for example, p-metal layer(s) 145 can be deposited on p-GaN layer 130. Any suitable p-metal layer can be used. By way of example, but not limitation, one embodiment of p-metal layers 145 can include a layer of silver followed by a barrier metal such as Ni or W followed by a bonding metal such as Au. In one embodiment, p-metal layer 145 can be reflective.

Figure 5:
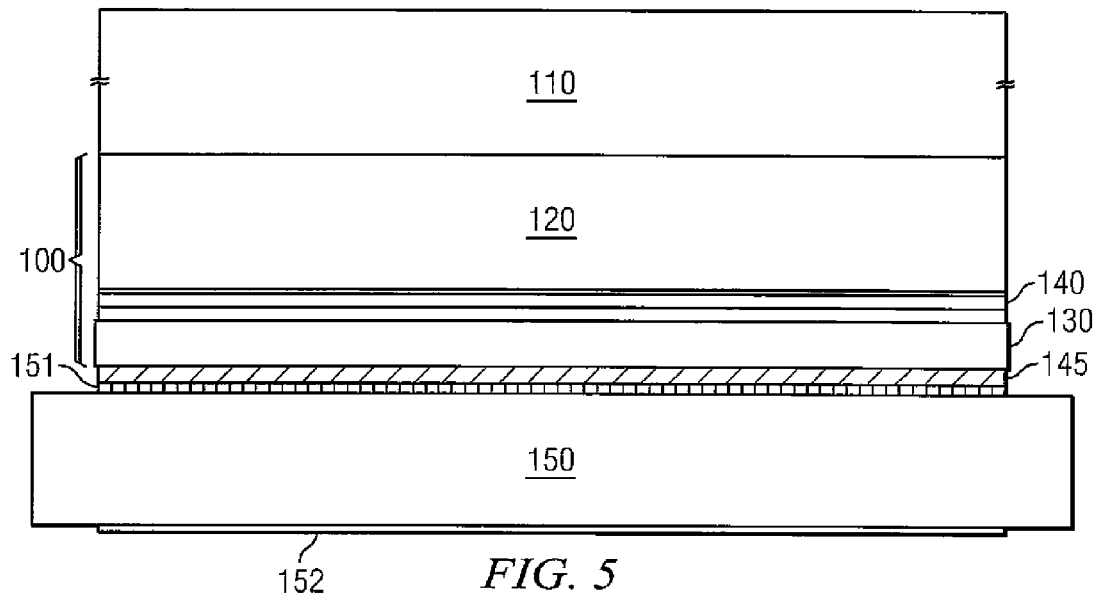
FIG. 5 is a diagrammatic representation of one embodiment of an LED layer structure bonded to a submount.

FIG. 5 is a diagrammatic representation of one embodiment of an LED layer structure 100 bonded to a submount 150. Submounts for providing structural support and/or electrical connections for LEDs are known in the art and any suitable submount known or developed in the art can be used. According to one embodiment, submount 150 can include one or more electrodes 151 in contact with or connected to p-metal layer(s) 145. Submount 150 can also have electrode(s) 152 connected to n-metal contacts as discussed below. Submount 150 can be constructed, according to one embodiment, of a conductive material. LED layer structure 100 can be bonded to a submount 150 using wafer bonding or other technique.

Figure 6:
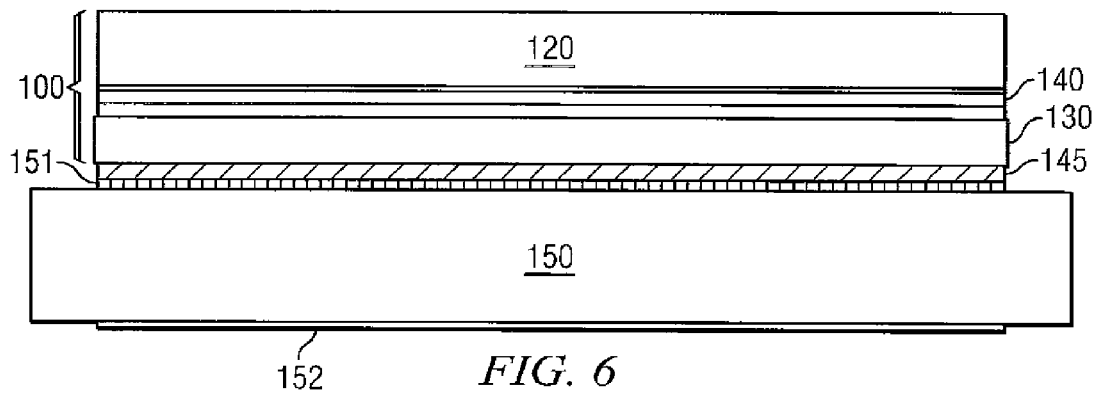
FIG. 6 is a diagrammatic representation of an embodiment of an LED layer structure with a thinned n-GaN layer.

FIG. 6 is a diagrammatic representation of an embodiment of LED layer structure 100 with a thinned n-GaN layer 120. Substrate 110 can be removed prior to or during thinning of n-GaN layer 120 using laser liftoff, mechanical grinding, chemical removal or other technique to expose n-GaN layer 120. According to one embodiment, for example, n-GaN layer 120 can be heated using a laser to cause the Ga to liquefy so that substrate 110 removed. GaN layer 120 can then be thinned to a desired thickness using laser liftoff, mechanical grinding, chemical removal, inductively-coupled plasma etching, chemical etching, photoelectochemical etching and/or polishing or other technique. The n-GaN layer 120 does not have to be roughened as it will not act as a waveguide.

According to one embodiment, the combined the thickness of p-GaN layer 130, quantum well layer 140 and n-GaN layer 120 is less than or equal to the wavelength of light that the quantum well layer generates. For example, in the case of a blue LED, the thicknesses can be selected so that the combined thickness is less than 460 nanometers or other selected wavelength of blue light. Continuing with this example, n-GaN layer 120 can be 300 nanometers, 200 nanometers, 100 nanometers, 50 nanometers or other thickness. While in the previous example the entire layer stack of p-GaN, n-GaN and quantum wells is less than the wavelength, in another embodiment only one side is thinned to be less than the wavelength. In one embodiment, for example, the thickness of the n-GaN layer 120 and any other layers between quantum well layer 140 and air (or other medium) is less than the wavelength of light generated in the medium while the p-GaN layer may has a greater thickness.

Figure 7:
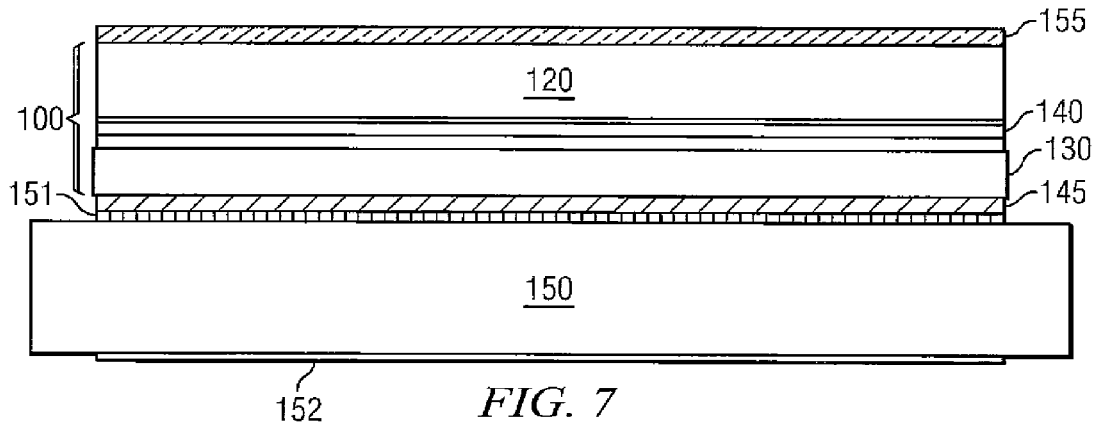
FIG. 7 is a diagrammatic representation of one embodiment of an LED layer structure with a transparent metal layer.

When n-GaN layer 120 is a desired thickness, a layer of substantially transparent metal 155 can be deposited on n-GaN layer 120 as illustrated in the example of FIG. 7. The metal can be a thin layer of Gold, ITO or other metal that allows transmittance of light. Substantially transparent metal layer 155 can include any metal layer that does not appreciably absorb light. In one embodiment, metals that have high absorption coefficients can be used for layer 155 if the thickness is small that the layer does not unduly prevent photon tunneling.

Figure 8:
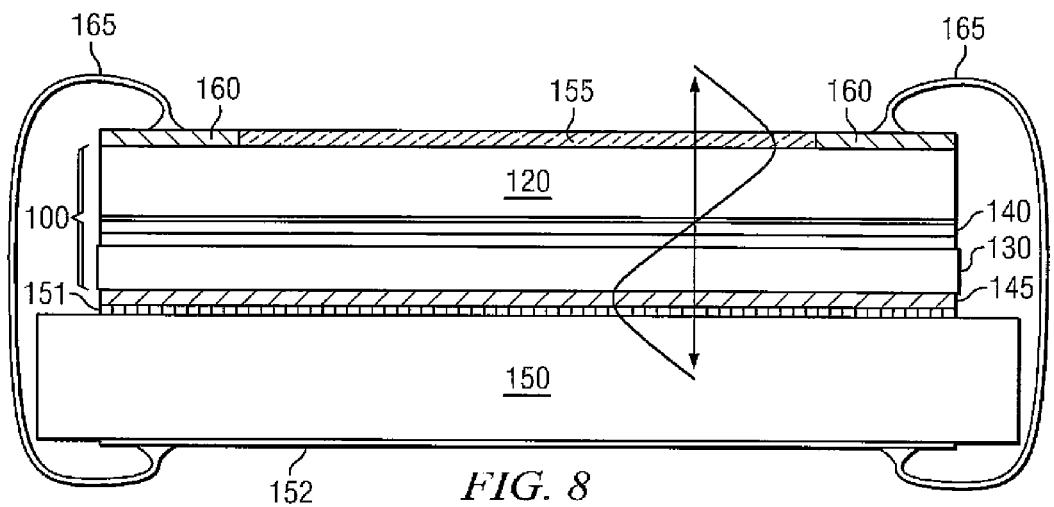
FIG. 8 is a diagrammatic representation of an embodiment of an LED layer structure with contacts.

FIG. 8 is a diagrammatic representation showing that the embodiment of LED layer structure 100 has a thickness that is less than the wavelength of light produced. Additionally, FIG. 8 illustrates n-metal contacts 160. The n-metal contacts 160 can be deposited over a portion of n-GaN layer 120. Any suitable contact metal can be used, including, but not limited to Ni/Au, Ti/Ni/Au, Ti/Al/Au, ITO and others. Electrical connections 165 can be coupled to the contacts 160 and to appropriate leads of submount 150.

Figure 9:
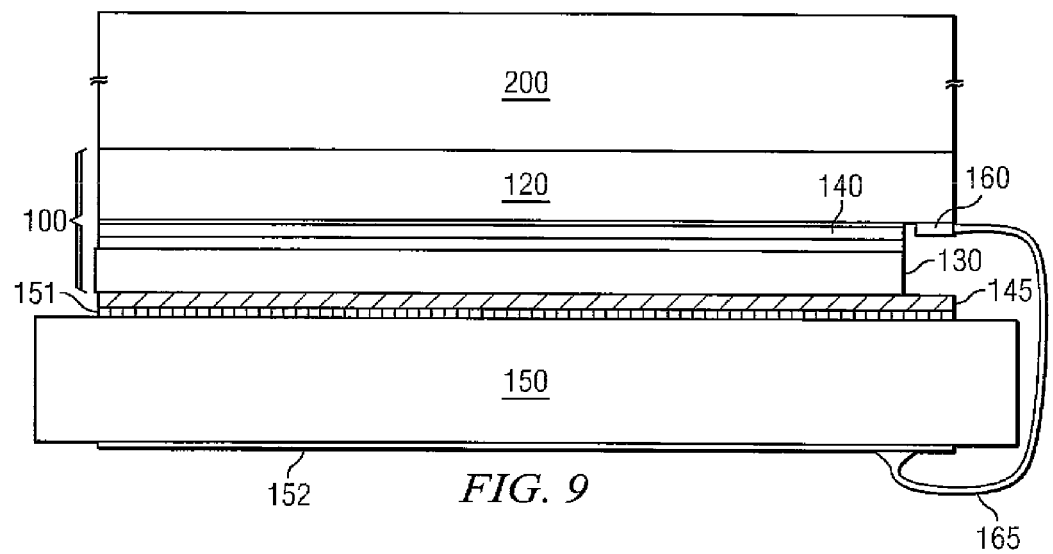
FIG. 9 is a diagrammatic representation of an embodiment of an LED layer structure with a substrate.

In the above embodiments, LED layer structure 100 does not include a substrate. In other embodiments a new substrate can be bonded to the LED. FIG. 9 is a diagrammatic representation of one embodiment of substrate 200 bonded to LED layer structure 100. Substrate 200 can be made of any suitable substrate material including, but not limited to, sapphire, diamond, molded glass or other substrate material. Substrate 200 can be bonded to n-GaN layer 120 or another layer, such as a buffer layer, using an optical adhesive.

In the embodiment of FIG. 9, light tunnels into the substrate rather than directly into air. Some efficiency may be lost due to internal reflection in the substrate. To reduce this loss, substrate 200 can be shaped. According to one embodiment, the substrate can be shaped as described in U.S. patent application Ser. No. 11/906,194 entitled "LED System and Method" which is hereby fully incorporated by reference herein.

The above-described embodiments use the example of an LED that is constructed from GaN materials. However, embodiments of the present invention can also employ other alloy layers. Moreover, while FIG. 8 illustrates the entire LED layer structure as having a thickness that is less than the wavelength of light, in other embodiments only one side of the LED layer has a thickness that is less than the wavelength of light generated.

In the foregoing specification, the disclosure has been described with reference to specific embodiments. However, as one skilled in the art can appreciate, embodiments of the LEDs disclosed herein can be modified or otherwise implemented in many ways without departing from the spirit and scope of the disclosure. Accordingly, this description is to be construed as illustrative only. It is to be understood that the forms of the disclosure herein shown and described are to be taken as exemplary embodiments. Equivalent elements or materials may be substituted for those illustrated and described herein. Moreover, certain features of the disclosure may be utilized independently of the use of other features, all as would be apparent to one skilled in the art after having the benefit of this description of the disclosure.

What is claimed is:

1. A light-emitting diode (LED) device comprising:
an LED layer structure comprising a quantum well layer adapted to generate light having a wavelength, a p-doped alloy layer on a first side of the quantum well layer, an n-doped alloy layer on a second side of the quantum well layer obverse from the first side and between the quantum well layer and a medium;
an electrode electrically connected to the p-doped alloy layer; and
an electrode electrically connected to the n-doped alloy layer;
wherein the combined thickness of the LED layer structure on the second side of the quantum well layer including the n-doped alloy layer is thinner than the wavelength of light that the quantum well layer is adapted to generate to allow light generated by the quantum well layer to photon tunnel to the medium.

2. The LED device of claim 1, further comprising one or more additional layers on the second side between the quantum well layer and the medium, wherein the combined thickness of the one or more additional layers and the n-doped alloy layer is less than the wavelength of light that the quantum well layer is adapted to generate.

3. The LED device of claim 2, wherein the p-doped alloy layer is p-GaN and the n-doped alloy layer is n-GaN.

4. The LED device of claim 3, wherein the one or more additional layers on the second side of the quantum well layer comprise a substantially transparent metal layer disposed on a surface of the n-GaN.

5. The LED device of claim 3, wherein the LED layer structure further comprises one or more additional layers on the first side of the quantum well layer.

6. The LED device of claim 5, wherein the one or more additional layers on the first side of the quantum well layer comprises a p-metal layer disposed on a surface of the p-GaN.

7. The LED device of claim 6, wherein the entire LED layer structure is thinner than the wavelength of light that the quantum well layer is adapted to generate.

8. The LED device of claim 3, wherein the medium is air.

9. The LED device of claim 8, wherein the LED layer structure is less than 460 nanometers thick.

10. The LED device of claim 3, further comprising a substrate bonded to the LED layer structure wherein the substrate is the medium.

11. The LED device of claim 1, further comprising a submount to support the LED layer structure and provide the electrodes.

12. The LED device of claim 1, further comprising one or more electrical contacts disposed on a surface of the n-doped alloy layer.

13. A light-emitting diode (LED) device comprising:
a submount comprising a first electrode and a second electrode;
an LED layer structure comprising:
a quantum well layer sandwiched between an n-GaN layer on a first side and a p-GaN layer on a second side, the quantum well layer adapted to generate light having a wavelength, wherein the LED structure on the first side of the n-GaN layer has a combined thickness that is less than the wavelength of light that the quantum well layer is adapted to generate;
a p-metal layer disposed on the p-GaN layer and electrically connected to the first electrode;
one or more n-metal contacts disposed on the n-GaN layer and electrically connected to the second electrode;
a substantially transparent metal layer disposed on the n-GaN layer;
wherein the LED layer structure is adapted to allow light generated by the quantum well layer to tunnel to air separated from the quantum well layer by the n-GaN layer and the substantially transparent metal layer.

14. The LED device of claim 13, wherein the entire LED layer structure has a combined thickness that is less than the wavelength of light that the quantum well layer is adapted to generate.

15. The LED device of claim 13, wherein the entire LED layer structure is less than 460 nanometers thick.

16. A method of forming a light-emitting diode (LED) device comprising:
- forming an LED layer structure comprising a quantum well layer adapted to generate light having a wavelength and disposed between an n-GaN layer on a first side of the quantum well layer and a p-GaN layer on a second side of the quantum well layer, the LED layer structure having a substrate disposed thereon;
- applying a p-metal layer to the p-GaN layer;
- coupling the LED layer structure to a submount;
- removing the substrate;
- thinning the n-GaN layer to a selected thickness; and
- applying a substantially transparent metal layer to the thinned n-GaN layer;
- wherein the resulting LED layer structure has a thickness less than the wavelength of light that the quantum well layer is adapted to generate to allow light generated by the quantum well layer to tunnel to air.

17. The method of claim 16, further comprising thinning the p-GaN layer prior to mounting the LED layer structure on the submount.

18. The method of claim 17, further comprising electrically connecting the p-GaN layer and the n-GaN layer to electrodes.

* * * * *